United States Patent [19]
Lesk et al.

[11] Patent Number: 5,927,993
[45] Date of Patent: Jul. 27, 1999

[54] BACKSIDE PROCESSING METHOD

[75] Inventors: Israel A. Lesk, Phoenix; Robert B. Davies; Robert E. Rutter, both of Tempe; Lowell E. Clark, Phoenix, all of Ariz.

[73] Assignee: Motorola, Inc., Schaumburg, Ill.

[21] Appl. No.: 07/829,660

[22] Filed: Feb. 3, 1992

[51] Int. Cl.⁶ .................................................. H01L 21/301
[52] U.S. Cl. ........................ 438/455; 438/458; 438/459; 438/464
[58] Field of Search .................. 437/228; 148/DIG. 135; 438/455, 458, 459, 464

[56] References Cited

U.S. PATENT DOCUMENTS 4,946,716  8/1990  Corrie ........................... 148/DIG. 135
5,165,283  11/1992  Kurtz et al. .............................. 73/727

*Primary Examiner*—Charles Bowers
*Assistant Examiner*—Matthew Whipple
*Attorney, Agent, or Firm*—Harry Wolin

[57] ABSTRACT

A method useful in the backside processing of semiconductor wafers includes providing a semiconductor wafer having a first surface that has been substantially processed. The processed first surface of the semiconductor wafer is bonded to a handle wafer. Once bonded to the handle wafer, backside processing may be performed on the wafer. Following backside processing, the wafer is sawn while still bonded to the handle wafer. The individual dice are then removed from the handle wafer. This process involves fewer handling steps of the semiconductor wafer and the handle wafer provides support to the semiconductor wafer during backside processing thereby reducing opportunities for breakage.

10 Claims, 2 Drawing Sheets

BACKSIDE PROCESSING METHOD

FIELD OF THE INVENTION

This invention relates, in general, to semiconductor device manufacturing, and more particularly to a method useful in the backside processing of semiconductor wafers.

BACKGROUND OF THE INVENTION

In the fabrication of semiconductor devices, it is often necessary to perform process steps on what is commonly known as the backside of the devices. This is most commonly done while the devices are in wafer form. Typical backside process steps include thinning, the implantation of impurities, the activation of implanted impurities and the deposition of backside metal contacts.

One well known and widely employed method of backside processing includes mounting a substantially processed wafer face down on a vacuum chuck. By substantially processed, it is meant that frontside processing is virtually complete and only backside processing steps remain. The face of the wafer is generally protected or some type of pad is disposed on the vacuum chuck itself. Once the wafer is held in place on the vacuum chuck, the backside of the wafer is ground back or thinned to a desired thickness. The wafer is typically thinned by a chemical/mechanical polishing method. It is well known to finish the thinning only chemically so that backside surface damage is minimized.

Following the thinning of the wafer, it is removed from the vacuum chuck and backside metal is deposited by methods well known in the art. Following the deposition of backside metal, the wafer is mounted face up on a plastic adhesive and is sawed into individual dice. Wafer saws may be adjusted so that they will completely cut through the wafer without substantially cutting the plastic adhesive on which the wafer is mounted. The plastic adhesive holds the diced wafer in place so that the individual dice may be picked and placed from the plastic.

Although the process set forth above works very well for some applications, it requires a significant amount of wafer handling. Especially when dealing with very thin wafers, there is tendency for the wafers to break during handling. Breakage is often prior to mounting on the plastic adhesive.

Accordingly, it would be desirable to have a method useful in the backside processing of semiconductor wafers that allows very thin wafers to be backside processed and prepared for packaging that results in significantly reduced wafer breakage.

SUMMARY OF THE INVENTION

A method useful in the backside processing of semiconductor wafers includes providing a semiconductor wafer having a first surface on which substantial processing has occurred and a second surface. The processed first surface of the wafer is bonded to support means and backside processing steps are then performed. Following the backside processing steps, the semiconductor wafer is removed from the handle wafer. Preferably, dicing of the wafer into individual dice occurs prior to removal from the handle wafer.

DETAILED DESCRIPTION OF THE DRAWINGS

Figure 1:
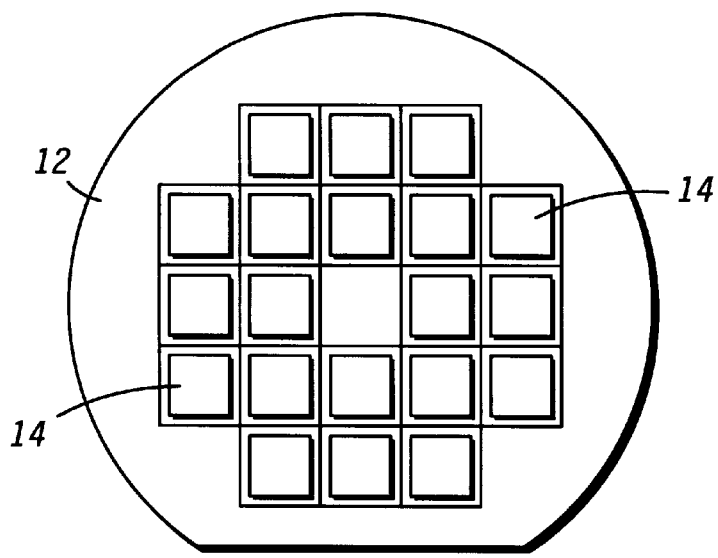
FIGS. 1–2 are schematic top views of the top surface of a substantially processed semiconductor wafer.
Figure 2:
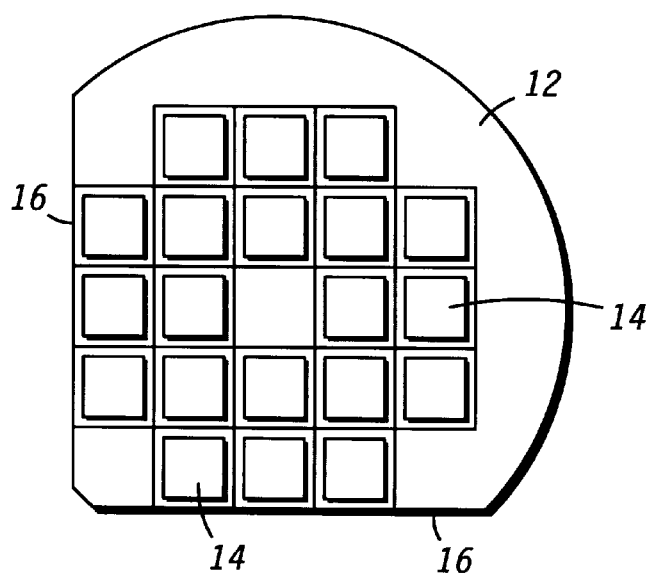

FIGS. 1–2 are schematic top views of the top surface 12 of a substantially processed semiconductor wafer 10. Wafer 10 comprises silicon herein although the process disclosed may be performed on wafers of other materials. By substantially processed, it is meant that virtually all processing has been performed on top surface 12 and only processing on a bottom surface 20 of the wafer remains to be done. Wafer 10 includes a plurality of individual devices or integrated circuits 14 having been substantially processed thereon. It should be understood that virtually all frontside wafer processing has been performed, typically through passivation and contact etch, and backside processing of wafer 10 is ready to be initiated.

Referring specifically to FIG. 2, flats 16 are cut in substrate 10. Flats 16 are cut by wafer sawing methods well known in the art and in the particular embodiment depicted herein, are formed adjacent to each other. Flats 16 provide dimensional references to the orthogonal scribe lanes of individual devices or integrated circuits 14. This enables the precise location of patterns of individual devices or integrated circuits 14 as well as regions therein thus allowing exact registration of patterns on bottom surface 20 relative to geometries on top surface 12. This also enables precise registration to the scribe lanes for dicing purposes. Flats 16 allow backside processing and/or wafer sawing to be precisely performed. Without the dimensional reference provided by flats 16, it would be virtually impossible to properly align backside processing steps and wafer sawing to individual devices or circuits 14. It should be understood that dimensional references may be provided by means other than flats 16. For example, a plurality of laser formed holes may be utilized. Additionally, it should be understood that it is not necessary for dimensional reference means to completely penetrate wafer 10. It is sufficient that such means are of a depth to be distinguishable following wafer thinning as will be explained presently.

Figure 3:
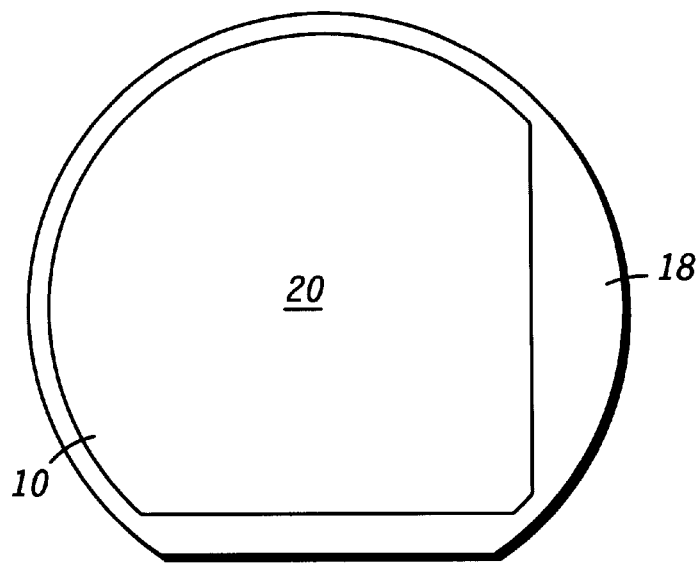
FIGS. 3–4 are schematic top views of the bottom surface of the semiconductor wafer of FIGS. 1–2 wherein the semiconductor wafer is bonded to a handle wafer.
Figure 4:
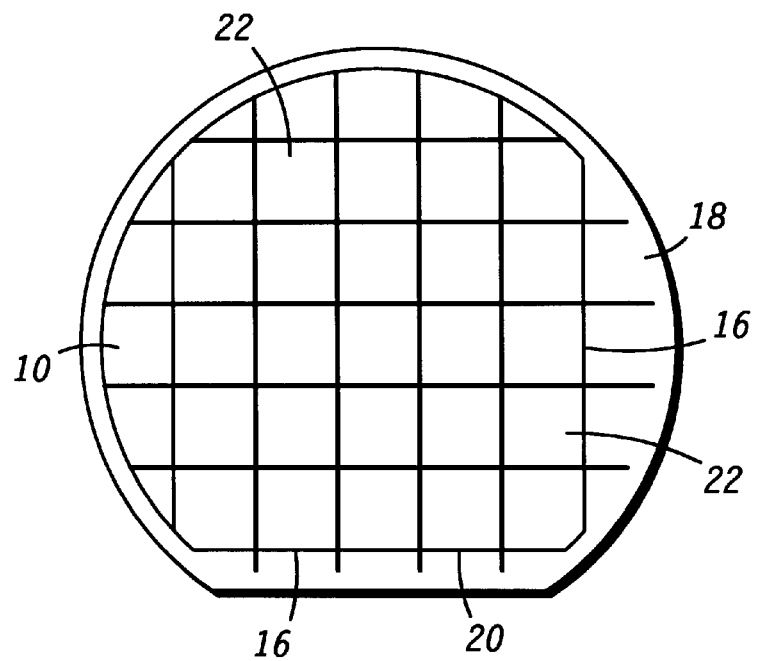

FIGS. 3–4 are schematic top views of semiconductor wafer 10 bonded to a handle wafer 18. Although handle wafer 18 is shown, other support means will be apparent to those of skill in the art and may be utilized. As shown, top surface 12 of wafer 10 is bonded to handle wafer 18. Bottom surface 20 of wafer 10 is exposed. Top surface 12 of wafer 10 may be bonded to handle wafer 18 by a variety of methods. Typically, a polyimide material or a photoresist is employed. However, it should be understood that other materials such as spin-on glass, wax, phosphosilicate glass and borophosphosilicate glass may be employed. Whatever material is employed to bond wafer 10 to handle wafer 18, it should be understood that bonding must not damage devices or circuits 14 on top surface 12 of wafer 10. Therefore, it is desirable that the material used to bond wafer 10 to handle wafer 18 also protect devices or circuits 14.

Following the bonding of wafer 10 to handle wafer 18, backside processing may be performed on bottom surface 20 of wafer 10. Because wafer 10 is now supported by handle wafer 18, there is much less chance of breakage during backside processing steps. Typical processing steps performed on bottom surface 20 of wafer 10 include thinning wafer 10 by chemical/mechanical polishing or etching, chemical etching, or the like. Further, photosteps or other types of masking may be performed on bottom surface 20 as well as implanting impurities into wafer 10, activating impurities implanted in wafer 10 and forming conductive contact material such as metal on bottom surface 20 of wafer 10. It should be understood that the temperatures utilized in the processing steps performed on bottom surface 20 must not exceed the temperature capability of the bonding material or the metal system of top surface 12.

In the manufacture of a specific enhanced insulated gate bipolar transistor (EIGBT) such as is disclosed by Terry et al. in copending patent application Ser. No. 07/715,864 entitled "Enhanced Insulated Gate Bipolar Transistor", the process may be employed as follows. After substantially processing devices or circuits on the frontside of the wafer, flats are cut therein to provide orthogonal dimensional references and the wafer is adhered frontside down to a handle wafer. Photoresist is employed to adhere the wafer to the handle wafer. Once the wafer is bonded to the handle wafer, the backside of the wafer is ground so that the wafer has a thickness on the order of 4–5 mils. A photostep is then employed to form a mask on the backside of the wafer being processed. The mask is employed to implant P+ and N+ emitter/drain regions which are then activated by a laser anneal. This activation heats only the back surface and not the bulk or front surface of the device. Following activation of the emitter/drain regions, metal is deposited on the backside of the wafer. The flats cut into the wafer prior to the bonding to the handle wafer make possible the alignment of the photomask so that the backside implants can match frontside patterns with an accuracy of approximately + or –1 mil.

Now referring specifically to FIG. 4. Once processing has been completed on bottom surface 20 of wafer 10, the individual devices or circuits of wafer 10 are sawn into individual dice 22. Flats 16 provide the initial X and Y position for the saw blade which is then stepped by known die size. The saw blade is set so that it will cut through wafer 10 and possibly a portion of the bonding material bonding wafer 10 to handle wafer 18 without significantly cutting handle wafer 18. This allows handle wafer 18 to be used more than once. After sawing, individual dice 22 remain bonded to handle wafer 18.

Following wafer sawing, individual dice 22 are removed from handle wafer 18. Preferably, individual dice 22 may be removed by placing dice 22 and handle wafer 18 into an agitated chemical bath. It should be understood that one of skill in the art will readily be able to determine many ways to remove dice 22 from handle wafer 18.

It is often convenient for individual dice 22 to remain in a fixed position relative to other individual dice 22 following their removal from handle wager 18. This keeps dice 22 from scattering and enables pick and place operations to be performed with relative ease. A mesh cage or the like may be employed to leave dice 22 in position for easy pick and place. If the sawn dice 22 are placed in a mesh cage prior to their removal from handle wafer 18 the mesh cage will hold dice 14 in position following the removal from handle wafer 18.

The process disclosed herein greatly reduces the number of handling steps that must be performed on wafer 10 during backside processing. In addition, handle wafer 18 provides increased support of wafer 10 during backside processing. The combination of fewer handling steps and wafer support greatly reduces the opportunities for wafer breakage and therefore, increases yield. Additionally, because wafer 10 is supported, it may be easily and practically thinned to lesser thicknesses than previously available. For example, gallium arsenide power devices could be thinned to thicknesses of less than 25 micrometers.

Thus it is apparent that there has been provided, in accordance with the invention, an improved method useful in the backside processing of semiconductor wafers. While specific embodiments of the present invention have been shown and described, further modifications and improvements will occur to those of skill in the art. It is desired that it be understood, therefore, that this invention is not limited to the particular forms shown and it is intended in the appended claims to cover all modifications which do not depart from the spirit and scope of this invention.

What is claimed is:

1. A method useful in the backside processing of semiconductor wafers comprising the steps of:

providing a semiconductor wafer having a first surface being substantially processed and a second surface;

forming means for providing dimensional reference to said processed first surface from said second surface;

bonding said first surface of said semiconductor wafer to support means;

performing at least one processing step on said second surface of said semiconductor wafer; and removing said semiconductor wafer from said support means.

2. The method of claim 1 wherein the bonding step includes bonding the first surface of the semiconductor wafer to support means with at least one of polyimide, photoresist, spin-on glass, wax, phosphosilicate glass and borophosphosilicate glass.

3. The method of claim 1 wherein the performing step includes performing at least one of thinning the semiconductor wafer, masking the second surface of said semiconductor wafer, implanting impurities into said semiconductor wafer, activating implanted impurities and forming conductive contact material on said second surface of said semiconductor wafer.

4. The method of claim 1 wherein the forming means step includes forming flats or laser formed holes.

5. The method of claim 4 further including the step of dicing the semiconductor wafer prior to the removing step.

6. The method of claim 5 wherein the removing step includes placing the semiconductor wafer and support means in holding means to keep individual dice in place.

7. The method of claim 1 wherein the removing step includes removing the semiconductor wafer from support means in an agitated chemical bath.

8. A method of thinning and dicing a semiconductor wafer comprising the steps of:

providing a semiconductor wafer having a first surface being substantially processed and a second surface;

forming flats on said semiconductor wafer to provide dimensional reference to said processed first surface from said second surface;

bonding said first surface of said semiconductor wafer to a handle wafer with a photoresist material;

thinning said semiconductor wafer from said second surface;

forming a metal contact on said second surface of said semiconductor wafer;

dicing said semiconductor wafer while bonded to said handle wafer to form individual dice; and removing said individual dice from said handle wafer.

9. The method of claim 8 further including the step of applying holding means to the individual dice prior to the removing step.

10. The method of claim 8 wherein the removing step includes removing the individual dice from the handle wafer in an agitated chemical bath.

\* \* \* \* \*